United States Patent
Chou et al.

(10) Patent No.: US 9,523,152 B2
(45) Date of Patent: Dec. 20, 2016

(54) METALLIC DIELECTRIC PHOTONIC CRYSTALS AND METHODS OF FABRICATION

(71) Applicants: Jeffrey Brian Chou, Walnut Creek, CA (US); Sang-Gook Kim, Wayland, MA (US)

(72) Inventors: Jeffrey Brian Chou, Walnut Creek, CA (US); Sang-Gook Kim, Wayland, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 110 days.

(21) Appl. No.: 14/478,381

(22) Filed: Sep. 5, 2014

(65) Prior Publication Data

US 2015/0068599 A1  Mar. 12, 2015

Related U.S. Application Data

(60) Provisional application No. 61/874,405, filed on Sep. 6, 2013, provisional application No. 61/905,472, filed on Nov. 18, 2013.

(51) Int. Cl.
*G02F 1/00* (2006.01)
*G02F 1/03* (2006.01)
(Continued)

(52) U.S. Cl.
CPC ....... *C23C 16/45525* (2013.01); *C23C 14/046* (2013.01); *C23C 14/081* (2013.01);
(Continued)

(58) Field of Classification Search
CPC ... B41J 2/385; B01L 2400/0415; B82Y 20/00; H01L 27/14643; G02F 1/09; G02F 1/0356; G02F 1/03; G02F 1/0126; G02F 1/093; G02F 1/0123; G02F 1/0322; G02F 1/167; G02B 6/3512; G02B 26/001; G02B 27/145; G09F 9/372; G09G 3/346; H04J 14/02; H04Q 11/0005; G03G 13/22; G03G 17/04; G03G 15/321
(Continued)

(56) References Cited

U.S. PATENT DOCUMENTS

| | | |
|---|---|---|
| 5,932,029 A | 8/1999 | Stone et al. |
| 2003/0123827 A1* | 7/2003 | Salerno ................. B82Y 20/00 385/129 |

(Continued)

FOREIGN PATENT DOCUMENTS

WO  WO 2010-065635 A2  6/2010

OTHER PUBLICATIONS

International Search Report from corresponding International Application No. PCT/US2014/054232, mailed Dec. 22, 2014.
(Continued)

*Primary Examiner* — Dawayne A Pinkney
(74) *Attorney, Agent, or Firm* — Cooley LLP

(57) ABSTRACT

A metallic-dielectric photonic crystal is formed with a periodic structure defining a plurality of resonant cavities to selectively absorb incident radiation. A metal layer is deposited on the inner surfaces of the resonant cavities and a dielectric material fills inside the resonant cavities. This photonic crystal can be used to selectively absorb broadband solar radiation and then reemit absorbed radiation in a wavelength band that matches the absorption band of a photovoltaic cell. The photonic crystal can be fabricated by patterning a sacrificial layer with a plurality of holes, into which is deposited a supporting material. Removing the rest of the sacrificial layer creates a supporting structure, on which a layer of metal is deposited to define resonant cavities. A dielectric material then fills the cavities to form the photonic crystal.

24 Claims, 12 Drawing Sheets

(51) Int. Cl.

| | |
|---|---|
| H01L 31/00 | (2006.01) |
| C23C 16/455 | (2006.01) |
| C23C 14/04 | (2006.01) |
| C23C 14/08 | (2006.01) |
| G02B 1/113 | (2015.01) |
| H02S 10/30 | (2014.01) |
| H02S 40/44 | (2014.01) |
| B82Y 20/00 | (2011.01) |

(52) U.S. Cl.
CPC ............ *C23C 14/083* (2013.01); *G02B 1/113* (2013.01); *H02S 10/30* (2014.12); *H02S 40/44* (2014.12); *B82Y 20/00* (2013.01); *Y02E 10/60* (2013.01)

(58) Field of Classification Search
USPC ........ 359/321, 280–281, 283, 237–239, 259, 359/296, 322, 247, 250, 618; 345/84–85, 345/107; 430/31–32; 347/111–112; 399/131; 204/600; 250/214.1; 385/5, 385/16–18; 398/82
See application file for complete search history.

(56) References Cited

U.S. PATENT DOCUMENTS

| | | | |
|---|---|---|---|
| 2004/0150873 A1* | 8/2004 | Pearsall ................. | B82Y 20/00 359/321 |
| 2008/0223438 A1 | 9/2008 | Xiang et al. | |
| 2009/0212696 A1* | 8/2009 | Terao .................. | H01L 51/5265 313/506 |
| 2010/0224248 A1 | 9/2010 | Kenney et al. | |
| 2010/0259826 A1 | 10/2010 | Ji et al. | |
| 2012/0312360 A1 | 12/2012 | Shvets et al. | |

OTHER PUBLICATIONS

International Preliminary Report on Patentability and Written Opinion from corresponding International Application No. PCT/US2014/054232, issued Mar. 8, 2016.
Arpin, et al., "Three-dimensional self-assembled photonic crystals with high temperature stability for thermal emission modification," Nature Communications, 2013, pp. 1-8.
Aydin, et al., "Broadband polarization-independent resonant light absorption using ultrathin plasmonic super absorbers," Nature Communications, 2011, pp. 1-7.
Bermel, et al., "Design and global optimization of high efficiency thermophotovoltaic systems," Optical Express, 2010, pp. A314-A334, vol. 18, No. 103.
Biswas, et al., "Sharp thermal emission and absorption from conformally coated metallic photonic crystal with triangular lattice," Applied Physics Letters, 2008, pp. 063307 (1-3).
Celanovic, et al., "Design and optimization of one-dimensional photonic crystals for thermophotovoltaic applications," Optics Letters, 2004, pp. 863-865, vol. 29, No. 8.
Celanovic, et al., "Resonant-cavity enhanced thermal emission," Physical Review, 2005, pp. 075127 (1-6), B 72.
Celanovic, et al., "Two-dimensional tungsten photonic crystals as selective thermal emitters," Applied Physics Letters, 2008, pp. 193101 (1-3).
Chan, et al., "Toward high-energy-density, high-efficiency, and moderate-temperature chip-scale thermophotovoltaics," Proc. Natl. Acad. Sci., 2013, pp. 5309-5314, vol. 110, No. 14.
Chen, et al., "Characterization of Surface Electromagnetic Waves and Scattering on Infrared Metamaterial Absorbers," Physical Optics, 2012, 5 pages, eprint http://arxiv.org/abs/1212.2868.
Chen, et al., "Fabrication of Two-dimensional Photonic Crystals in AlGaInP/GaInP Membranes by Inductively Coupled Plasma Etching," Advanced Materials for Micro- and Nano-Systems, 2006, 3 pages.

Chou, et al., "Design of wide-angle selective absorbers/emitters with dielectric filled metallic photonic crystals for energy applications," Optical Society of America, 2013, pp. A144-A154, vol. 22, No. S1.
Chou, et al., "Low Aspect Ratio Nanophotonic Filled Cavities with Q-Matching for Scalable Thermophotovoltaic Power Conversion," IEEE, 2013, pp. 576-577.
Cui, et al., "Ultrabroadband Light Absorption by a Sawtooth Anisotropic Metamaterial Slab," Nano Letters, 2012, pp. 1443-1447, 12.3.
Fleming, et al., "All-metallic three-dimensional photonic crystals with a large infrared bandgap." Nature. 2002, pp. 52-55, vol. 417.
Garcia-Vidal, et al., "Surfaces with holes in them: new plasmonic metamaterials," J. Opt. A: Pure Appl. Opt., 2005, pp. S97-S101, vol. 7.
Ghebrebrhan, et al., "Tailoring thermal emission via Q matching of photonic crystal resonances," American Physical Society, 2011, pp. 033810 (1-6), 83(3).
Greffet, et al., "Coherent emission of light by thermal sources," Nature, 2002, pp. 61-64, vol. 416.
Hao, et al., "High performance optical absorber based on a plasmonic metamaterial," Applied Physics Letters 96, 2010, pp. 251104 (1-3).
Heinzel, et. al., "Radiation filters and emitters for the NIR based on periodically structured metal surfaces," Journal of Modern Optics, 2000, pp. 2399-2419, vol. 47, No. 13.
Hibbins, et al., "Experimental Verification of Designer Surface Plasmons," Science, 2005, pp. 670-672, vol. 308.
Kennedy, C. E., "Review of Mid- to High-Temperature Solar Selective Absorber Materials," National Renewable Energy Laboratory, 2002, 58 pages.
Kennedy, et al., "Progress in Development of High-Temperature Solar-Selective Coating," International Solar Energy Conference, 2005, 7 pages.
Kirikae, et al., "A silicon microcavity selective emitter with smooth surfaces for thermophotovoltaic power generation," Journal of Micromechanics and Microengineering, 2010, 7 pages.
Lee, et al., "Hafnia-plugged microcavities for thermal stability of selective emitters," Appl. Phys. Lett., 2013, pp. 241904 (1-5), 102(24).
Lenert, et al., "A Nanophotonic Solar Thermophotovoltaic Device," Nature Nanotechnology, 2014, 25 pages.
Liang, et al., "Scalable photonic crystal chips for high sensitivity protein detection," Optical Society of America, 2013, pp. 32306-32312, vol. 21, No. 26.
Lim, et al., "Development of metal etch mask by single layer lift-off for silicon nitride photonic crystals," Microelectronic Engineering, 2011, pp. 994-998.
Lin, et al., "A three-dimensional photonic crystal operating at infrared wavelengths," Nature, 1998, pp. 251-253, vol. 394.
Liu, et al., "Infrared Perfect Absorber and Its Application As Plasmonic Sensor," American Chemical Society, Nano Letters, 2010, pp. 2342-2348.
Liu, et al., "Large Area, 38 nm Half-Pitch Grating Fabrication by Using Atomic Spacer Lithography from Aluminum Wire Grids," Nano Letters, 2006, pp. 2723-2727, vol. 6, No. 12.
Liu, et al., "Taming the Blackbody with Infrared Metamaterials as Selective Thermal Emitters," Physical Review Letters, 2011, pp. 045901 (1-4), 107(4).
Martinez, et al., "Optical properties and structure of $HfO_2$ thin films grown by high pressure reactive sputtering," Journal of Physics D: Applied Physics, 2007, pp. 5256-5265.
Moreno, et al., "Three-dimensional photonic-crystal emitter for thermal photovoltaic power generation," Applied Physics Letters, 2003, pp. 380-382, vol. 83, No. 2.
Nam, et al., "Solar thermophotovoltaic energy conversion systems with two-dimensional tantalum photonic crystal absorbers and emitters," Solar Energy Materials & Solar Cells, 2014, pp. 287-296.
Pendry, et al., "Mimicking Surface Plasmons with Structured Surfaces," Science, 2004, pp. 847-848, vol. 305.
Pralle, et al., "Photonic crystal enhanced narrow-band infrared emitters," Applied Physics Letters, 2002, pp. 4685-4687, vol. 81, No. 25.

(56) References Cited

OTHER PUBLICATIONS

Rahmlow, et al., "New Performance Levels for TPV Front Surface Filters," AIP Conf. Proc. Thermophotovoltaic Gener. Electr. 6th Conf., 2004, 10 pages.

Rephaeli, et al., "Absorber and emitter for solar thermo-photovoltaic systems to achieve efficiency exceeding the Shockley-Queisser limit," Optical Express, 2009, pp. 15145-15159, vol. 17, No. 17.

Rephaeli, et al., "Tungsten black absorber for solar light with wide angular operation range," Applied Physics Letters, 2008, pp. 211107 (1-3), 92(21).

Rinnerbauer, et al., "High-temperature stability and selective thermal emission of polycrystalline tantalum photonic crystals," Optics Express, 2013, 10 pages, vol. 21, No. 9.

Rinnerbauer, et al., "Large area selective emitters/absorbers based on 2D tantalum photonic crystals for high-temperature energy applications," Photonic and Phononic Properties of Engineered Nanostructures III, Proc. of SPIE, 2013, pp. 863207 (1-8), vol.

Rinnerbauer, et al., "Large-area fabrication of high aspect ratio tantalum photonic crystals for hightemperature selective emitters," American Vacuum Society, 2013, pp. 011802 (1-7).

Sai, et al., "High-temperature resistive surface grating for spectral control of thermal radiation," Applied Physics Letters, 2003, pp. 1685-1687, vol. 82, No. 11.

Sai, et al., "Solar selective absorbers based on two-dimensional W surface gratings with submicron periods for high-temperature photothermal conversion," Solar Energy Materials & Solar Cells, 2003, pp. 35-49.

Sai, et al., "Thermophotovoltaic generation with selective radiators based on tungsten surface gratings," Applied Physics Letters, 2004, pp. 3399-3401, vol. 85, No. 16.

Schlemmer, et al., "Thermal stability of micro-structured selective tungsten emitters," Thermophotovoltaic Generation of Electricity, American Institute of Physics, 2003, 11 pages.

Sergeant, et al., "Design of wide-angle solar-selective absorbers using aperiodic metal-dielectric stacks," Optics Express, 2009, 13 pages, vol. 17, No. 25.

Strasser, P., "The Development of a Fabrication Process for Passive Photonic Crystal Devices in InP/InGaAsP," Diss. ETH No. 18062, 2008, 210 pages.

Teperik, et al., "Omnidirectional absorption in nanostructured metal surfaces," Nature Photonics, 2008, pp. 299-301.

Tittl, et al., "Palladium-Based Plasmonic Perfect Absorber in the Visible Wavelength Range and Its Application to Hydrogen Sensing," 2011, American Chemical Society, Nano Letters, pp, 4366-4369,.

Walsh, et al., "High-temperature metal coating for modification of photonic band edge position," Optical Society of Arnerica, J. Opt. Soc. Am. B, 2009, pp. 1450-1455, vol. 26, No. 7.

Watts, et al., "Metamaterial Electromagnetic Wave Absorbers," Advanced Optical Materials, Materials Views, 2012, pp. OP98-OP120.

Woolf, et al., "Spoof surface plasmon waveguide forces," Optics Letters, 2014, pp. 517-520, vol. 39, No. 3.

Wu, et al., "Large-area wide-angle spectrally selective plasmonic absorber," American Physical Society, 2011, pp. 075102 (1-7), B 84.

Wu, et al., "Metamaterial-based integrated plasmonic absorber/emitter for solar thermo-photovoltaic systems," Journal of Optics, 2012, 7 pages.

Yeng, et al., "Enabling high-temperature nanophotonics for energy applications," Proc. Natl. Acad. Sci. U.S.A., 2011, pp. 2280-2285, vol. 109, No. 7.

Yeng, et al., "Performance analysis of experimentally viable photonic crystal enhanced thermophotovoltaic systems," Optics Express, 2013, pp. A1035-A1051, vol. 21, No. S6.

Yugami, et al., "Solar Thermophotovoltaic Using Al 203' Er3Al50 12 Eutectic Composite Selective Emitter," Twenty-Eighth IEEE Photovoltaic Specialists Conference, 2000, pp. 1214-1217.

* cited by examiner

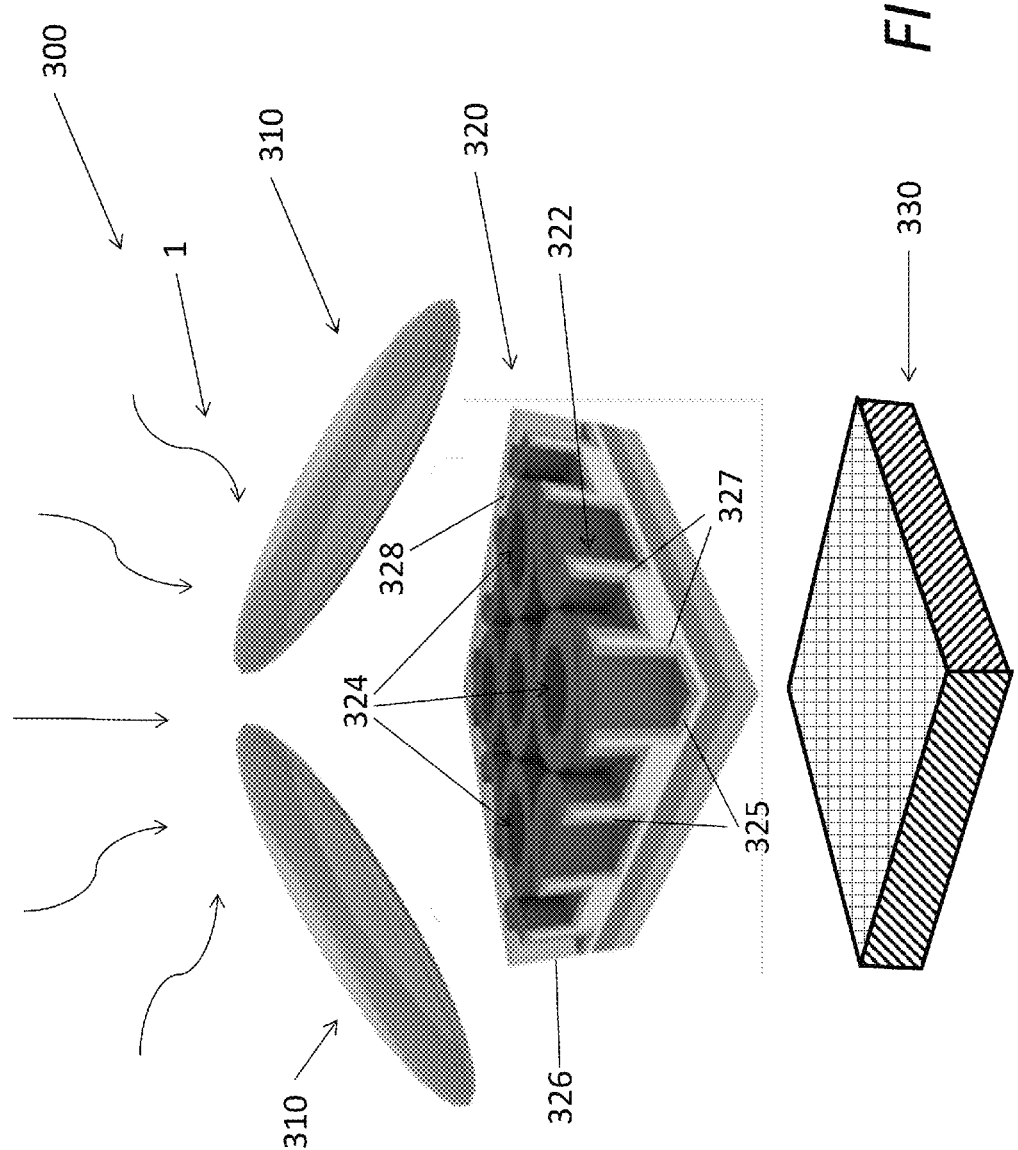

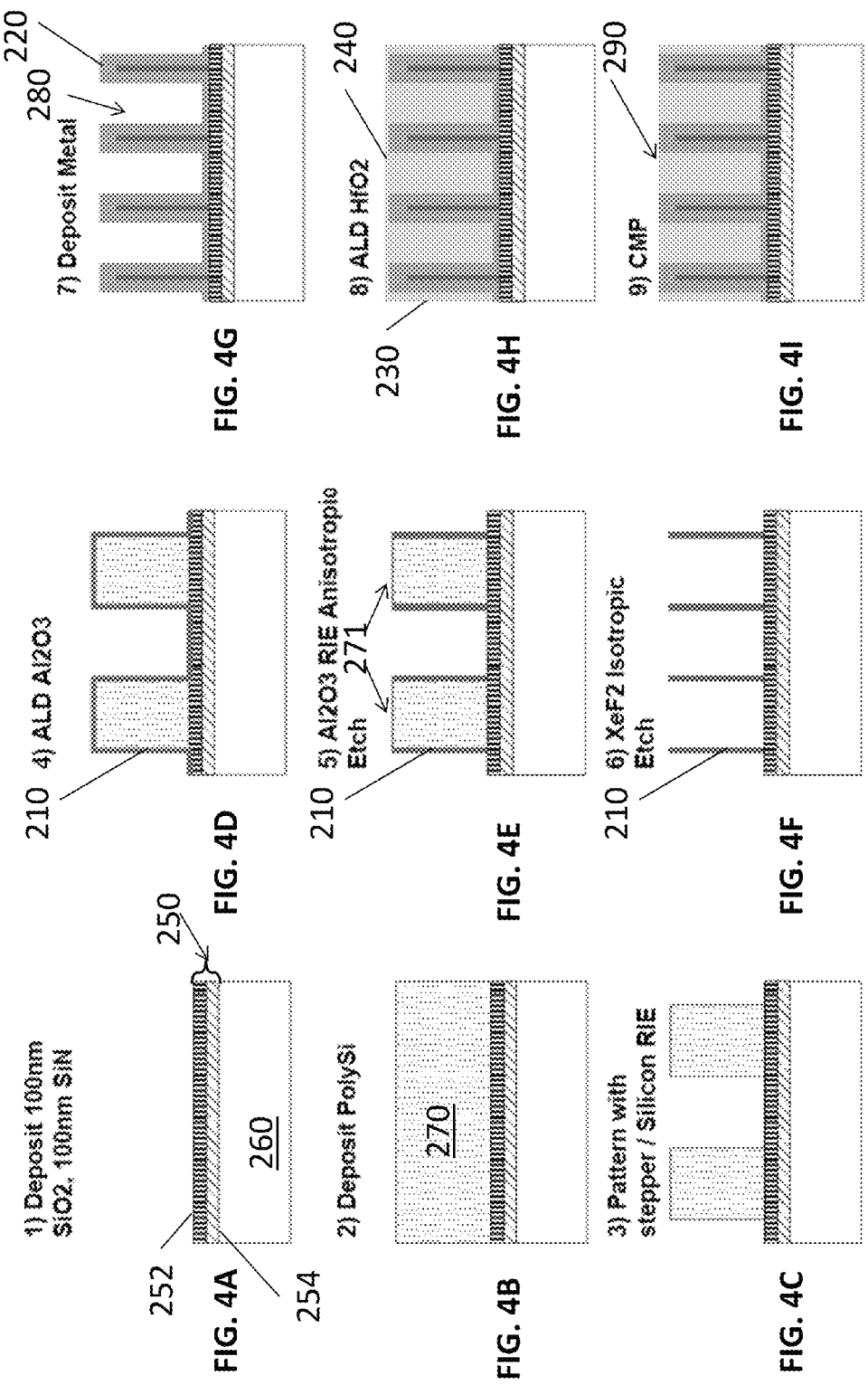

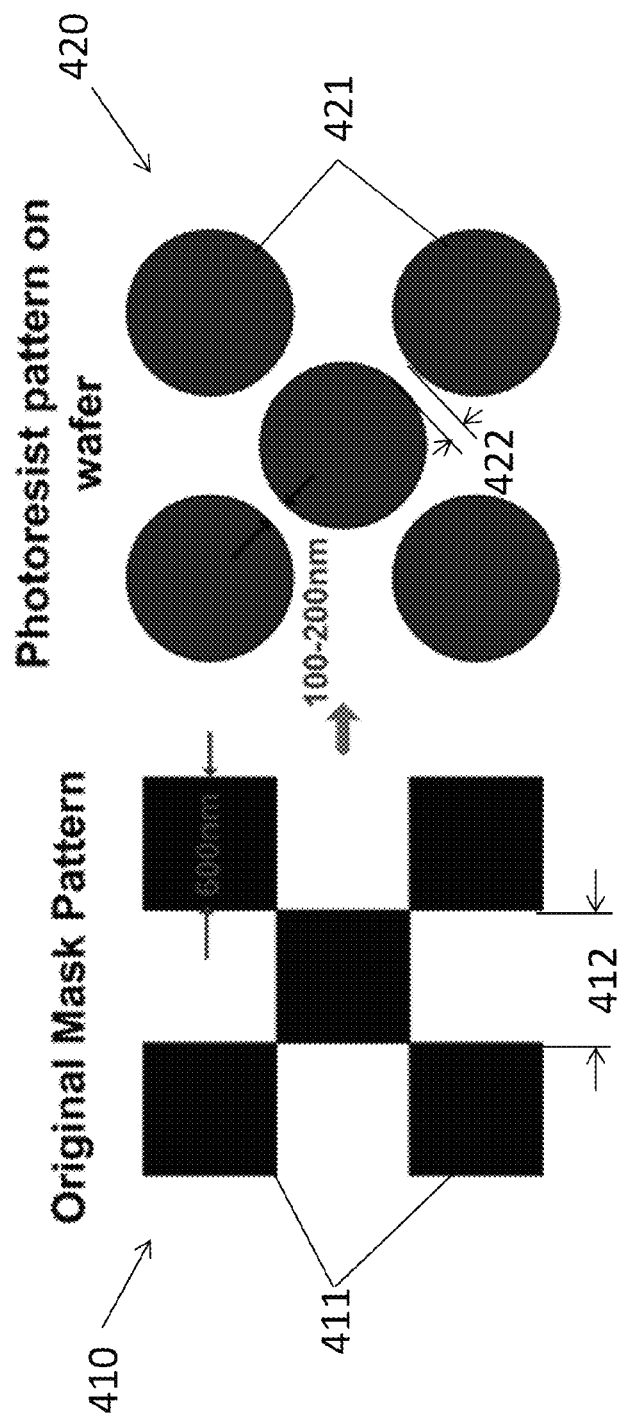

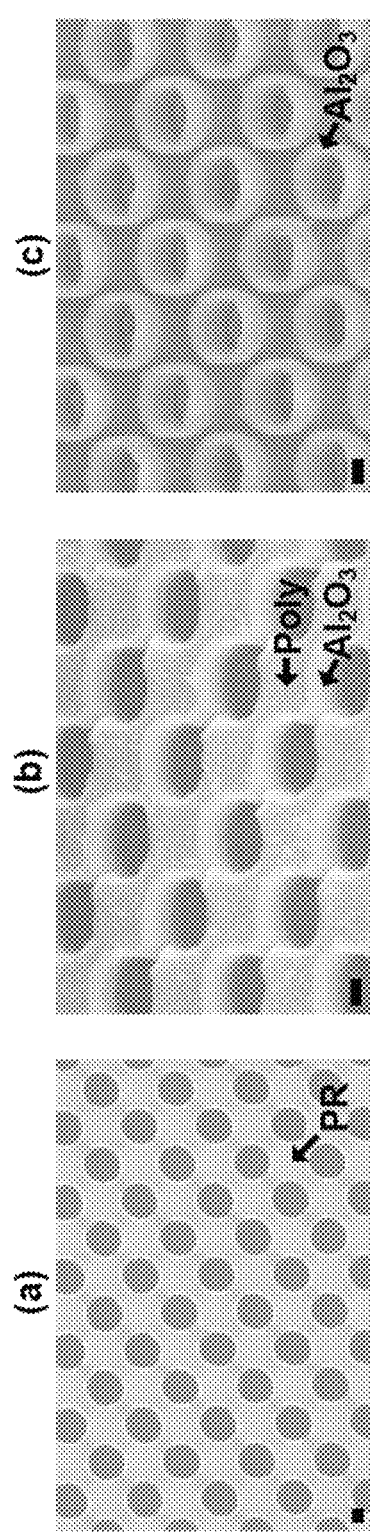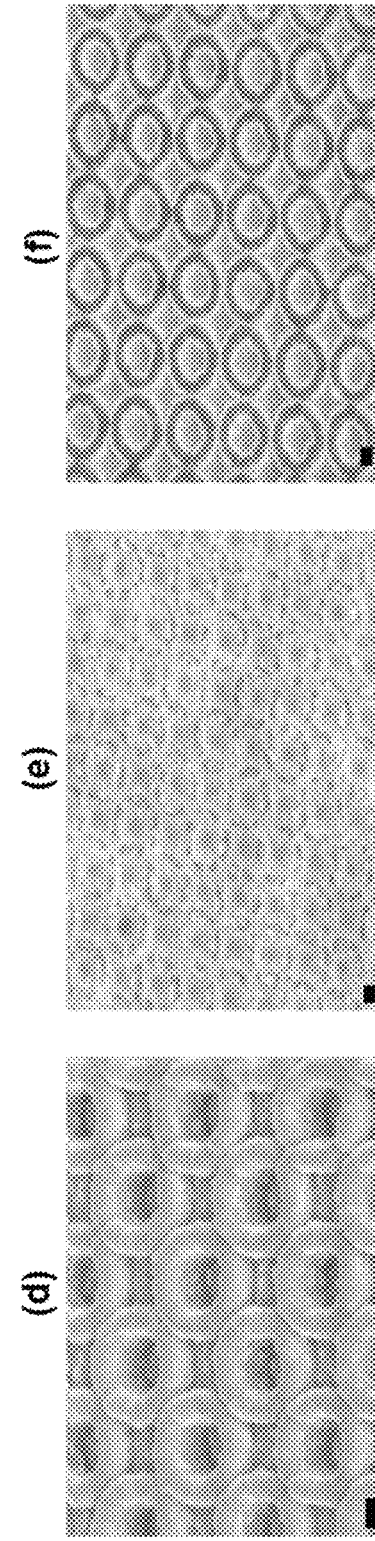
FIG. 5A  FIG. 5B  FIG. 5C
FIG. 5D  FIG. 5E  FIG. 5F

METALLIC DIELECTRIC PHOTONIC CRYSTALS AND METHODS OF FABRICATION

CROSS-REFERENCE TO RELATED PATENT APPLICATIONS

This application claims priority, under 35 U.S.C. §119(e), from U.S. Application No. 61/874,405, filed Sep. 6, 2013, and entitled "Wafer scale fabrication of 2D nanoscale metallic photonic crystals," which application is hereby incorporated herein by reference in its entirety.

This application also claims priority, under 35 U.S.C. §119(e), from U.S. Application No. 61/905,472, filed Nov. 18, 2013, and entitled "Wafer scale fabrication of 2D nanoscale metallic photonic crystals," which application is hereby incorporated herein by reference in its entirety.

GOVERNMENT SUPPORT

This invention was made with government support under Contract Nos. DE-SC0001299 and DE-FG02-09ER46577 awarded by the US Department of Energy. The government has certain rights in the invention.

BACKGROUND

Conventional photovoltaic systems, in which sunlight is directly converted into electricity by solar cells, suffer from two major drawbacks. First of all, they generally stop working after sunset when the electricity they are designed to generate is needed most. This intermittent nature also makes it difficult to integrate solar energy sources into existing power grids. Second, solar cells usually can only absorb light within a narrow band of wavelengths (e.g., in the near infrared (IR) band) out of the broadband spectrum of solar radiation, potentially limiting the overall conversion efficiency from optical energy to electrical energy.

SUMMARY

One system that addresses the drawbacks of conventional photovoltaic systems is a solar thermophotovoltaic (STPV) system 100 as shown in FIG. 1. In an STPV system 100, a selective absorber 122 converts the solar radiation transmitted through a solar concentrator 110 into thermal energy in order to heat up a selective emitter 124, which is tuned to re-radiate the thermal energy within a spectral band that can be efficiently absorbed by one or more solar cells 130. The intermediate conversion step realized by the wavelength selective device (absorber/emitter) 120 not only increases the overall conversion efficiency by matching the re-radiation wavelength to the band gap of solar cells, but also enables steady operation of solar power plants by storing the thermal energy for electricity generation in the nights.

At the heart of an STPV system is the selective absorber 122 in the wavelength selective device 120. Other than the selective absorption across the solar spectrum, the selective absorber may possess several other properties. Typically, a solar concentrator focuses radiation onto the selective absorber to minimize thermal emission loss. With increasing levels of optical concentration, sunlight is delivered at increasing angles of incidence. Actual optical concentrators also typically deliver diffuse-like radiation to the absorber due to non-idealities and practical design considerations. A selective absorber, therefore, may possess a large acceptance angle for absorption at wavelengths below a cut-off wavelength ($\lambda_c$), while maintaining low hemispherical emissivity above the cut-off wavelength. Furthermore, for maximum efficiency, a STPV absorber is expected to operate at temperatures over 1100 Kelvin, which poses a thermal-stability challenge. Finally, in order to achieve widespread application of STPV systems, the manufacturing of the selective absorbers can be wafer-scale.

Several methods have been developed to produce selective absorbers. For example, metal-based selective absorbers can have a tailored absorption spectrum. One dimensional metal dielectric stacks have demonstrated promising solar absorbing properties but tend to be unstable at temperatures greater than 600° C. Two-dimensional metallic air photonic crystals (MAPhC) can selectively absorb light in the near-IR via cavity modes and withstand high temperatures greater than 600° C.; however, their acceptance angle is limited to ±30° and the absorption in the visible spectrum is limited due to diffraction. Metamaterial and plasmonic based absorbers have demonstrated wide angle absorption due to their sub-wavelength periodic structures, but high temperature stability and wafer-scale fabrication have yet to be shown.

Exemplary embodiments of the present technology include apparatus and methods for selectively absorbing a radiation within a certain wavelength region and converting the radiation energy into thermal energy to heat up an emitter to re-radiate the energy at another wavelength region for electricity generation. Examples of these apparatus can exhibit selective absorption across a large portion the solar spectrum, reliability at high temperatures, and large acceptance angles.

In one example, the apparatus includes a photonic crystal with a periodic structure defining a plurality of resonant cavities to selectively trap and absorb an incident radiation below a cut-off wavelength that is determined by the wavelength of the optical modes supported by at least one of the resonant cavities. A layer of metal is disposed on the inner surface of the resonant cavity to improve the reflectivity. The resonant cavity is further filled with a dielectric material to adjust the optical modes to tune the spectral range within which radiation can be effectively absorbed. The dielectric material may also help, at least in part, maintain the periodic nanostructure of the photonic crystal at high temperatures and enlarge the acceptance angle at which the incident radiation can be absorbed. An anti-reflection coating may be deposited on the periodic structure to further reduce the reflection loss of the incident radiation energy. The anti-reflection coating may comprise the same dielectric materials as filled in the resonant cavities. A diffusion barrier layer may be disposed below the periodic structure to prevent diffusion or mixing of the metal layer and the substrate, further enhancing the thermal stability of the photonic crystal.

In another example, the apparatus includes a solar concentrator to receive the solar radiation and direct the radiation toward a wavelength selective device, which is in optical communication with the solar concentrator and absorbs the solar radiation below a cut-off wavelength and converts it into thermal energy in order to re-emit it as radiation in a predetermined wavelength band. The wavelength selective device has a metallic structure defining at least one resonant cavity that is filled by a dielectric material. An anti-reflection coating is deposited on the metallic structure to further improve absorption efficiency. Following the wavelength selective device is a photovoltaic cell to receive the re-emitted radiation and convert the radiation into electricity. The wavelength band of the re-emitted radiation is tuned to match the band gap of the photovoltaic cell in order to optimize the conversion efficiency. The metallic structure may comprise a periodic structure defining a plurality of resonant cavities and a layer of metal disposed on the inner surface of the resonant cavities to enhance absorption. The resonant cavity of the wavelength selective device may be designed such that it supports at least one resonant mode with a wavelength greater than the cut-off wavelength.

According to another example, a method to fabricate a photonic crystal that may function as a wavelength selective device is provided. The method starts from a substrate coated with a sacrificial layer, which is to be patterned with a plurality of holes arrayed at a period equal to or less than a predetermined wavelength. A supporting material is then deposited over the inner wall of the holes, followed by the removal of the rest portion of the sacrificial layer, leaving only the supporting material to form a supporting structure. The next step is to deposit a layer of metal on the surface of the supporting structure to define resonant cavities, which are filled with a dielectric material to form the photonic crystal. The method may further comprise depositing a layer of the dielectric material on top of the resonant cavities to form an anti-reflection coating. The method may also comprise annealing the resonant cavities to improve the absorption. A diffusion barrier layer may be coated on the substrate to prevent the metal layer from mixing with the substrate and therefore help, at least in part, to maintain the nanostructure of the photonic crystal at high temperatures.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3 shows a system that converts solar radiation into electricity using a selective absorber photonic crystal like the one shown in FIG. 2.

FIGS. 4A-4K illustrate a process of fabricating a photonic crystal with wavelength selective properties like the one shown in FIG. 2.

FIGS. 5A-5F show scanning electron microscope (SEM) images of the photonic crystal at different points in the fabrication process illustrated in FIGS. 4A-4K.

DETAILED DESCRIPTION

Figure 1:
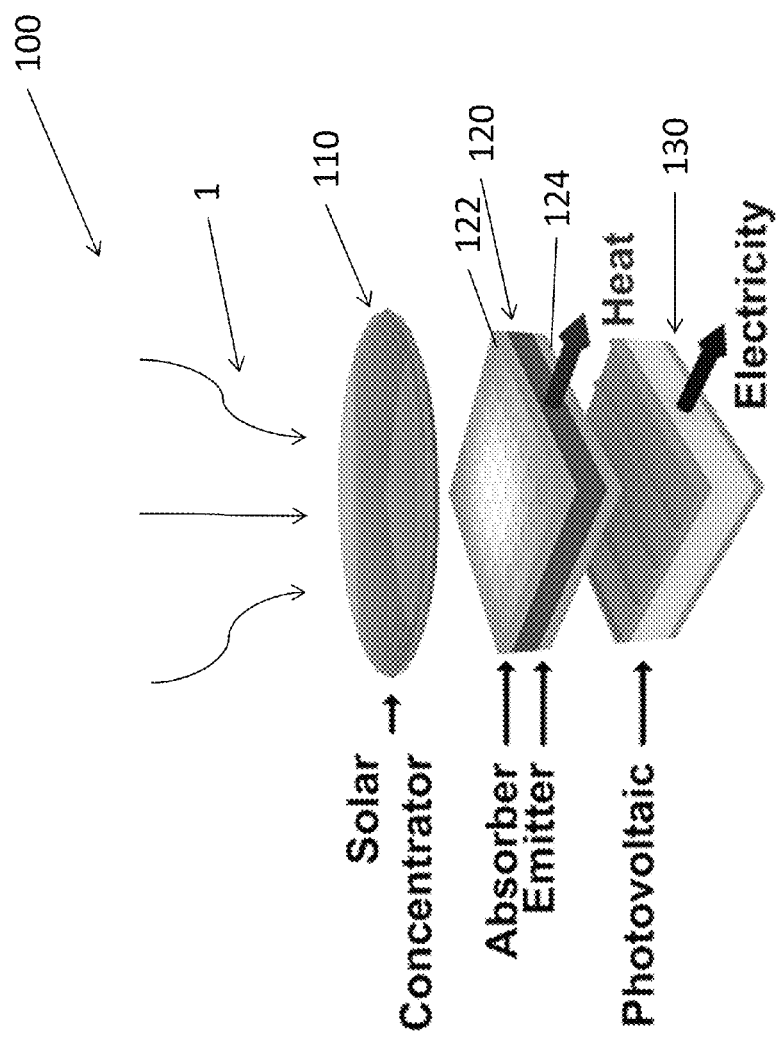
FIG. 1 shows a STPV system that generates electricity from solar radiation via an intermediate step of selective absorption and reemission.

A possible form of an absorber with wavelength-selective properties as used in an STPV system is a two-dimensional photonic crystal that comprises a periodic array of resonant cavities. On the microscopic scale, the basic element of selective absorbers is an individual resonant cavity or waveguide, which can effectively trap and absorb radiation of certain wavelength that is in resonance with one of the cavity modes. Therefore, the distribution of cavity modes of each resonant cavity determines the overall shape of the absorption spectrum of a selective absorber. On the other hand, on the macroscopic scale, the periodic distribution of resonant cavities collectively creates a two dimensional grating structure, which diffracts incident radiation according to classical grating equations. Diffraction induces losses to absorption because diffraction directs the incident radiation away from the selective absorber rather than into it. As a result, grating parameters, such as period and incident angle, determine the absolute absorption percentage of selective absorbers. Due to this cavity-grating duality, designing a selective absorber with good efficiency may be based at least in part on theories in both fields.

Without being bound by any particular theory, it appears that the selective absorption of a selective absorber is controlled at least in part by the cut-off wavelength of the cavity modes. For incident light with free-space wavelength greater than the cut-off wavelength of the cavity ($\lambda_c$), the incident light has no supported cavity mode to couple into, and the light is thus reflected. Incident light with a free-space wavelength less than the cut-off wavelength of the cavity ($\lambda_c$) couples into the cavity modes and thus absorption is enhanced due to the increased interaction time with the walls. For illustrative purpose only, the cavity modes for a cylindrical waveguide can be analytically calculated by:

$$\lambda_{mn} = \frac{2\pi(r + \delta(\lambda_{m,n}))n}{\chi'_{mn}} \quad (1)$$

where $\lambda_{mn}$ is the free-space wavelength of the cavity mode (m, n), r is the radius of the cavity, $\delta(\lambda_{mn})$ is the skin depth as a function of wavelength, n is the refractive index of the material in the cavity. $\chi'_{mn}$ is the root of the derivative of Bessel function of the first kind (TE fundamental mode). For typical STPV systems, the cut-off wavelength is set to the band gap wavelength of the photovoltaic cell, and is thus a predetermined constant. As a result, the cavity radius and the refractive index can be adjusted to match a particular cut-off wavelength. By choosing a cavity index n>1, the radius of the cavity can be reduced by a factor proportional to n.

Efficient coupling of incident lights at oblique angles into cavities may be achieved by reducing or minimizing diffraction losses. Without being bound by any particular theory, diffraction losses may allow free-space radiation to reflect into undesired diffraction channels instead of coupling into the cavity modes. An analysis of diffraction in the case of the grating structure of a selective absorber can begin with the grating equation:

$$a(\sin \theta_i + \sin \theta_m) = m\lambda, m = \pm 1, \pm 2, \pm 3 \quad (2)$$

where a is the period, $\theta_i$ is the incident angle of the light, $\theta_m$ is the diffractive angle of order m, and $\lambda$ is the free-space wavelength of light. The onset of diffraction at order m for normally incident light ($\theta_i$)=0° occurs when $\theta_m$=90° which leads to a=m$\lambda$. For light at oblique angles, the onset of diffraction at order m occurs at:

$$\theta_i = \sin^{-1}(\lambda m/a \pm 1) \quad (3)$$

According to Equation (3), larger ratio of $\lambda$/a leads to larger value of $\theta_i$, thereby allowing larger incident angles of light impinge on the selective absorber without causing diffractive losses. Note that the period can be a factor of 2 smaller than the free space wavelength for $\theta_i$ to be 90° at the m=1 mode (the cut-off mode).

As previously discussed, for STPV systems, the cut-off wavelength $\lambda_c$ is usually determined at least in part by the band gap wavelength of the photovoltaic cell. One way to reduce the period a without changing the cut-off wavelength $\lambda_c$ is to increase the index of the cavity n. For example, using Equation (1) with an ideal metal where ($\lambda_{mn}$)=0, with an air filled cavity of n=1, radius r=586 nm, period a=2r+100 nm, $\lambda_c$=2 µm, the ratio $\lambda_c$/a=1.57, which yields a maximum incident angle of 34.8°. However, if the cavity is filled with a dielectric material with n=1.3, the radius reduced to r=450 nm, =2 µm, then the ratio $\lambda_c$/a=2 which yields a maximum incident angle of 90°. Thus even a small increase in the cavity refractive index can increase significantly the incident angle without incurring diffraction losses at the cut-off wavelength. To avoid diffraction losses for higher order modes, higher values of the cavity index is preferred.

A Resonant Cavity in a Metallic-Dielectric Selective Absorber

Figure 2:
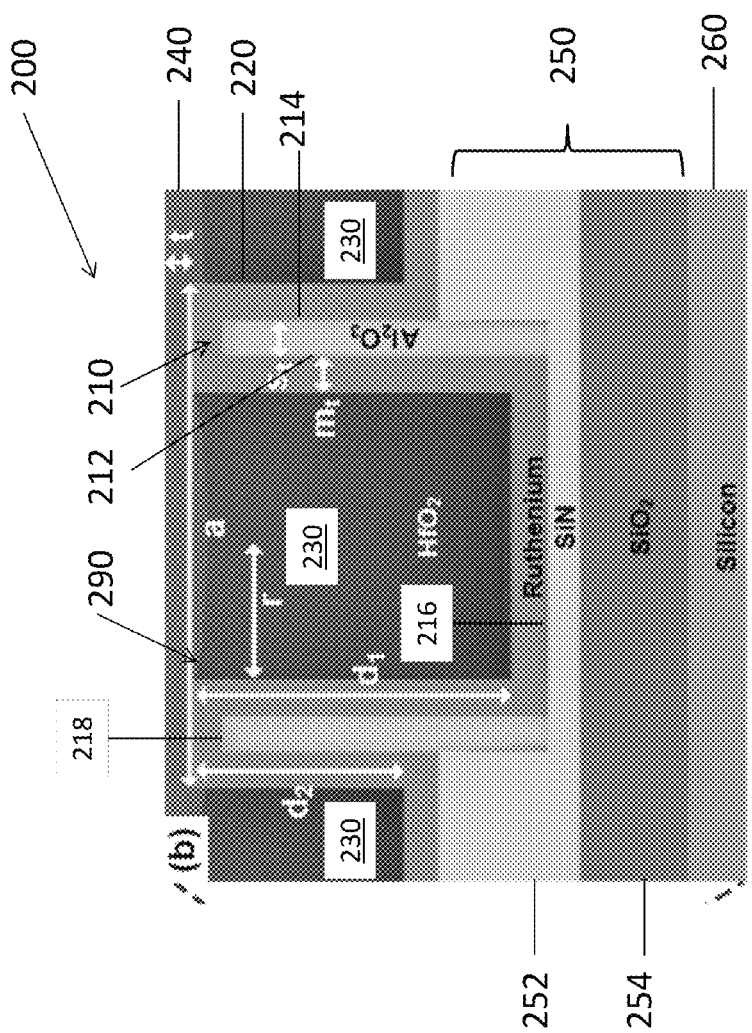
FIG. 2 shows a cross section view of a selective absorber according to one exemplary embodiment.

As one possible form of a selective absorber, a photonic crystal may comprise a periodic array of resonant cavities with wavelength selective properties. FIG. 2 shows a cross-section view of a resonant cavity 200 in a periodic structure (not shown in FIG. 2) of a selective absorber according to one exemplary embodiment. The resonant cavity 200 includes a supporting wall 210 that has an inner surface 212, a metal layer 220 deposited on the inner surface 212, and a dielectric material 230 filled inside the resonant cavity. The outer surface 214 of the supporting wall 210, as well as the bottom 216 and top 218 of the cavity may also be coated with a metal layer 220. The dielectric material 230 may also fill all possible spaces between cavities as shown in FIG. 2.

The resonant cavity 200, in this particular embodiment, is cylindrical for the simplicity of theoretical analysis of cavity modes, but it may be of any shape including, among others, square, elliptical, rectangular, triangle, or any other polygon. The shape may even be irregular if a particular optical mode is desired. The material used to form the wall 210 of the resonant cavity may be compatible with conformal deposition via Atomic Layer Deposition (ALD) or other processes known in the art, and can be etched via reactive ion etching (RIE). The material may also be compatible with complementary metal-oxide-semiconductor (CMOS) processes and should have sufficient mechanical strength to stand by itself and support the metal layer 220 deposited on it. In one example, Alumina Oxide ($Al_2O_3$) is employed to form the supporting wall 210 that defines the resonant cavity 200. In other examples, $HfO_2$ or $TiO_2$ may also be used to form the supporting wall 210.

In operation, the metal layer 220 deposited on the inner surface of the resonant cavity reflects the radiation inside the resonant cavity to establish optical modes. The reflectivity of the metal layer 220 can be over 70% at wavelengths of interest (for example, 0.5 µm-2 µm), but it may be lower than 70% if, for example, the resonant cavity supports the desired optical mode(s). Wavelengths of interest may be the cut-off frequency as in an STPV system, or a desired transmission wavelength in an extraordinary optical transmission system. Materials that can be used for the metal layer 220 include tungsten, ruthenium, platinum, silver, tantalum, copper, gold and titanium, among others. However, for certain applications, non-metal materials such as silicon may also be used here as long as the reflectivity is sufficient.

For each wavelength of interest, there is a skin depth corresponding to each material used for the metal layer 220. As readily understood by those of skill in the art, the skin depth $\delta$ represents the depth to which radiation penetrates a given material according to Equation (4):

$$\delta \approx 2\rho\sqrt{\epsilon/\mu} \quad (4)$$

where $\rho$, $\epsilon$, and $\mu$ are the resistivity, the permittivity and the permeability of the material, respectively. The thickness of the metal layer 220 should be greater than the skin depth of the wavelength of interest in order to clearly define optical modes. If, however, the thickness of the metal layer 220 is less than the skin depth, incident radiation may penetrate through the metal layer and reach the supporting wall 210, which also defines a cavity and corresponding optical modes. In this case, the supporting wall 210 can alter the overall absorption spectra by supporting propagation of additional optical modes within the wall. By tuning the combination of the cavity wall and the metal layer, the desired absorption spectra can be achieved.

In operation, the dielectric material 230 inside the resonant cavity may fulfill one or more of the following purposes. First of all, the dielectric material 230 adjusts the refractive index of the resonant cavity and thereby tunes the optical modes inside the cavity according to Equation (1). Moreover, combinating Equations (1) and (3) demonstrates that the dielectric material 230 allows wide angle operation of the selective absorber by reducing the period without changing the cut-off wavelength, which is usually a predetermined value in a STPV system. The dielectric material 230 also improves the overall mechanical stability of the selective absorber. At high temperatures, for example, periodic arrays of empty cavities suffer from a series of curvature dependent degradations including surface diffusion, evaporation, recondensation and oxidation. Filling the cavities with dielectric material 230 creates an optically patterned but geometrically flat surface, thereby avoiding the degradation without compromising the optical function of the device.

The dielectric material 230 may be substantially transparent (for example, >90% transmission through the depth of the cavity) to radiation at wavelengths of interest. For example, if used in an STPV system, then the dielectric material 230 may transmit in the infrared region of the electromagnetic spectrum. Furthermore, the refractive index of the dielectric material 230 may be larger than one in order to increase the operating angle of the selective absorber. The operating angle of a selective absorber may be defined as the largest incident angle at which the radiation of interest can still be absorbed by more than 70%. It is also beneficial to take into account the thermal expansion coefficient (TEC) of the dielectric material 230 and the surrounding metal layer 220 when designing the resonant cavities. While ramping up to high operating temperatures, if the dielectric material 230 expands more than the metal layer 220, a compressive stress across the dielectric/metal layer is created, thus mechanically securing the filling and improving the thermal stability. This can be achieved by selecting a dielectric material with a TEC smaller than that of the surrounding metal material. Materials that exhibit these mechanical, optical, and thermal properties include, but are not limited to, $HfO_2$, $SiO_2$, $TiO_2$, $Al_2O_3$, TiN, and other oxide ceramics. Note that for some applications, not all of these properties are necessary. For example, if room temperature operation is desired, then the TEC consideration can be ignored.

The performance of a selective absorber may also depend on the dimensions of the cavity and the various layers. On a microscopic scale, the radius and depth of the cavity, as well as the thickness of the wall and the metal layer, can affect the performance of the selective absorber by altering the optical modes. According to Equation (1), the wavelength of optical modes is a function of both the radius and the refractive index of the dielectric material 230. The radius can lie in a wide range from about 50 nm to about 5 μm because one can adjust the refractive index inside the cavity to fit the predetermined cut-off wavelength. The depth of the cavity can be greater than half of the period of the periodic structure, but a smaller depth is also feasible since other parameters can compensate or balance effects induced by a shallow depth. The thickness of the metal layer, as described before, can be greater than the skin depth at the wave length(s) of interest, but may be smaller than the skin depth as well since the cavity wall can also trap radiation and alter the optical modes inside the cavity. Experimentally, a thickness greater than 50 nm is sufficient to establish desired optical modes and achieve desired absorption spectrum. The thickness of the cavity wall may be based on mechanical considerations. As long as the wall is strong enough to stand by itself and support the metal layers deposited on it, the thickness is good. A practical range would be between 10 nm to 200 nm.

Turning to the macroscopic picture of the selective absorber, the device can be designed from a grating point of view. In one example, the period of the selective absorber is selected to be less than a predetermined cut-off wavelength to support at least one optical mode whose wavelength matches the selective absorber's cut-off wavelength. The cut-off wavelength can be, for example, a band gap wavelength of a photovoltaic cell. A practical range of this cut-off wavelength can be from about 0.5 μm to about 3 μm. In another example, the period of the selective absorber is selected to be less than half of a predetermined cut-off wavelength in order to reduce or minimize the diffraction loss at large incident angles. In this particular embodiment, the selective absorber can effectively absorb incident radiation at an incident angle from 0° (normal incidence) to about 70° (close to grazing incidence).

Note that for STPV applications, the selective absorber, in the form of a photonic crystal, can be designed with reference to a cut-off wavelength, which may be further selected based on the band gap wavelength and/or the operating temperature of a photovoltaic cell. In other applications, including but are not limited to plasmonics and extraordinary optical transmission, the photonic crystal may be designed using other physical quantities as the reference such as the desired emission direction of beams.

In one aspect, the dielectric-metal interface 290 (for example, FIG. 4I) is directly exposed to the incident radiation. In another aspect (for example, FIG. 2 or FIG. 4H), an anti-reflection coating 240 is deposited on top of the periodic structure to reduce reflection losses and further increase the absorption. The anti-reflection coating 240 can be a single layer film or a multi-layer stack. The single layer film can be made of dielectric materials as readily understood in the art. The multi-layer stack can comprise alternating layers of a low-index material like silica and a higher-index material as readily understood in the art. For instance, the anti-reflection coating 240 may comprise the same dielectric material 230 filled in the resonant cavity. This is particularly convenient for fabrication since the anti-reflection coating and the dielectric material filling may be deposited in a single fabrication step. The anti-reflection coating 240 may have a thickness from about 1 nm to about 200 nm depending on the desired performance of the selective absorber.

The selective absorber may also include a diffusion barrier layer 250 disposed between the periodic structure and a substrate 260 to prevent the metal layer 220 from mixing with the substrate 260 either at high temperatures or at room temperatures. The diffusion barrier layer 250 may comprise two sub-layers 252 and 254. The first sub-layer 252 may comprise SiN and the second sub-layer may comprise $SiO_2$. The first sub-layer 252 can be selectively etched during fabrication and provide support for the cavity walls.

Solar-Thermal Photovoltaic Systems with Metallic-Dielectric Selective Absorbers

FIG. 3 shows a system 300 for converting solar radiation into electricity using a selective absorber like the one shown in FIG. 2. The system includes a solar concentrator 310 to collect solar radiation 1 over a larger area and focus it onto a smaller area of a wavelength selective device (selective absorber) 320 to increase the electrical power generated from each photovoltaic cell. The wavelength selective device 320 absorbs the solar radiation below a cut-off wavelength and converts it into thermal energy that is re-emitted as radiation in a predetermined wavelength band. Following the wavelength selective device 320 is a photovoltaic cell 330 to receive the re-emitted radiation and convert the radiation into electricity. The wavelength band of the re-emitted radiation can be tuned to match the band gap of the photovoltaic cell 330 in order to increase the conversion efficiency.

The solar concentrator 310 in the system 300 can increase the efficiency and reduce the cost of solar power since more electricity is obtained per photovoltaic cell. The solar concentrator can comprise various optical elements, including, but not limited to refractive lenses, diffractive lenses, spherical mirrors, parabolic mirrors, luminescent solar concentrators, and any other suitable element. The system 300 can include more than one solar concentrator 310 to collect solar radiation from different directions, thereby covering a larger solid angle and further increasing the collection efficiency.

This arrangement can also accommodate the changing positions of the sun during the day.

In this example, the wavelength selective device 320 includes a metallic structure 322 defining at least one resonant cavity 324 that is filled with a dielectric material 326 (for example, as shown in FIG. 2). An anti-reflection coating 328 is deposited on the metallic structure 322 to reduce diffraction losses and increase absorption efficiency.

The metallic structure 322 can be periodic with a period less than the wavelength selective device's cut-off wavelength. The shape of the resonant cavity 324 defined by the metallic structure 322 may depend on the desired optical modes or manufacturing constraints. In one example, the resonant cavity is cylindrical, which is convenient for computer simulation and practical fabrication. In other examples, the shape may be elliptical, square, rectangular, triangle, polygon, etc. The shape may even be irregular if a particular optical mode is desired.

The metallic structure 322 can have a surface reflectivity greater than 70% for radiation at wavelengths of practical interest. But the reflectivity may be below 70% given that other parameters of the metallic structure allows for desired optical modes. Materials that can be used for the metallic structure 322 include tungsten, ruthenium, platinum, silver, tantalum, copper, gold and titanium, among others. Non-metal materials, such as silicon, may also be used as long as desired optical modes can be established.

The metallic structure 322 may comprise two layers as shown in FIG. 3 (and described above with respect to FIG. 2): a periodic structure defining a plurality of resonant cavities 324 and a layer of metal 325 disposed on the cavity wall 327 of the resonant cavities. In one embodiment, the periodic structure may function as the supporting structure for the metal layer 325. The thickness of the metal layer in this embodiment can be greater than the skin depth of the incident radiation in the metal layer in order to define optical modes.

In another exemplary embodiment, the cavity wall 327 can define its own optical modes and alter the overall absorption spectrum of the entire wavelength selective device. In this embodiment, the thickness of the metal layer 325 may be less than the skin depth given that modes supported by the periodic structure itself can alter the absorption spectrum to a desired state.

In operation, the dielectric material 326 inside the resonant cavity may fulfill one or more of the following purpose: 1) adjust the refractive index of the resonant cavity so as to tune the optical modes inside the cavity; 2) allow wide incident angle operation of the selective absorber by reducing the period without changing the cut-off wavelength, which is usually a predetermined value in a STPV system; and 3) increase the overall mechanical stability of the wavelength selective device. The dielectric material 326 can be substantially transparent (for example, >50% transmission through the entire thickness of the dielectric layer) to infrared radiation, having a refractive index larger than one, and having a thermal expansion coefficient (TEC) greater than that of the metallic structure. Materials that may be used include, but are not limited to, $HfO_2$, $SiO_2$, $TiO_2$, $Al_2O_3$, TiN and other oxide ceramics.

The wavelength selective device 320 can be designed with the cut-off wavelength as the reference. The radius of the resonant cavity 324 can lie in a wide range from about 50 nm to about 5 μm to support desired optical modes in an STPV system. One can also adjust the refractive index inside the cavity to match at least one optical mode to the predetermined cut-off wavelength. Adjustment of the refractive index may be realized by using different dielectric materials 326, tuning the temperature of the resonant cavity 324, applying an electric field over the resonant cavity 324, or any other methods known in the art. Another possible way to tune the optical modes to match a predetermined cut-off wavelength, based at least in part on Equation (1), may involve adjusting the skin depth of the metal layer 325. One may change the skin depth by using different metal materials, tuning the temperature of the metal layer to alter its resistivity, or any other means known in the art.

The depth of the cavity 324 may be greater than half of the overall size of the cavity, which is the sum of the inner diameter plus the thickness of the cavity wall. A smaller depth is also feasible since other parameters may compensate or balance the effects induced by a shallow depth. The thickness of the metal layer 325 can be greater than the skin depth of the radiation of interest, but may be smaller as well since the cavity wall can also define its own cavity and alter the optical modes inside the wavelength selective device. Experimentally, a thickness greater than 50 nm can establish desired optical modes and achieve desired absorption spectrum. Designing the thickness of the cavity wall 327 may take into account its mechanical role of supporting the metal layer 325 during fabrication. A practical range would be between 10 nm to 200 nm.

The overall size of the cavity in one example is selected to be less than a predetermined cut-off wavelength to support at least one optical mode having a wavelength in match with the cut-off wavelength. The cut-off wavelength can be, for example, a band gap wavelength of a photovoltaic cell. A practical range of this cut-off wavelength can be from about 0.5 μm to about 3 μm. In another example, when the metallic structure comprise a periodic structure, the overall size of the cavity, which may also be the period of the periodic structure, is selected to be less than half of a predetermined cut-off wavelength to minimize the diffraction loss at large incident angles. In this example, the selective absorber can absorb incident radiation at an incident angle from 0° (normal incidence) to about 70° (close to grazing incidence).

The wavelength selective device 320 may also include an anti-reflection coating 328, which may comprise the same dielectric material 326 in the resonant cavity. This is convenient for fabrication since the anti-reflection coating and the dielectric material may be deposited in a single fabricate step. The anti-reflection coating 328 may have a thickness from about 1 nm to about 200 nm depending on the desired performance of the selective absorber.

The photovoltaic cell 330 in the system 300 may come in various forms such as crystalline silicon cells, thin film cells, multijunction cells or any other suitable photovoltaic cells known in the art. Suitable thin film cells include but are not limited to Cadmium telluride, copper indium gallium selenide, GaAs, and silicon thin film cells. The band gap of the photovoltaic cell 330 can be approximately equal to the cut-off wavelength of the re-emitted radiation from the wavelength selective device 320 in order to increase (if not maximize) the solar-to-electricity conversion efficiency.

Processes for Fabricating Metallic-Dielectric Selective Absorbers

FIG. 4A to FIG. 4I illustrate a CMOS compatible method of fabricating a selective absorber as shown in FIG. 2 and FIG. 3. The method starts from a substrate 260 coated with a diffusion barrier layer 250 as shown in FIG. 4A. The diffusion barrier layer 250 may comprise two sub-layers 252 and 254. In one example, the first sub-layer 252 may comprise SiN and the second sub-layer 254 may comprise $SiO_2$. In FIG. 4B, a sacrificial layer 270 is coated above the diffusion barrier layer 250. In FIG. 4C, the sacrificial layer 270 is patterned with a plurality of holes arrayed in a substantially periodic way at a period a. The period a of the periodic array can be less than a predetermined wavelength of light. In one example, the predetermined wavelength can be a band gap wavelength of a photovoltaic cell and may lie in a range between 0.5 µm and 3 µm. A supporting material is then deposited over the inner walls of the holes as shown in FIG. 4D. The deposition can be conformal so the supporting material can form a layer of uniform thickness over the inner walls of the holes. FIG. 4E shows an anisotropic removal of the supporting material that is on top of the sacrificial layer 270 and on the bottom of the holes so as to create openings 271 through which the sacrificial layer can be etched. The next step, as shown in FIG. 4F, is to selectively remove the remaining portion of the sacrificial layer 270 but not the supporting material in order to create a supporting structure 210 defined by the layer of the supporting material. The supporting structure 210 has substantially the same shape of the plurality of holes because the deposition of the supporting material is conformal. On the supporting structure, a layer of metal 220 is deposited to form a plurality of resonant cavities 280 (FIG. 4G). The deposition of metal can also be conformal in order to create uniform dimensions of the resulting resonant cavities 280. FIG. 4H shows another deposition step, in which a dielectric material is deposited into the cavities, as well as any possible space between cavities. This step may further include depositing a layer of dielectric material on the resonant cavities to form an anti-reflection coating (ARC) layer 240. Or, the ARC may comprise the same dielectric material in the cavities. In this case, the ARC layer 240 may be formed by intentionally depositing an extra amount of dielectric material once the cavities have been filled. FIG. 4I shows a polishing step in which the surface of the selective absorber is polished. In one example (FIG. 4I), the polishing step exposes the metal dielectric interface 290 directly toward incident radiations. In another example, a layer of anti-reflection coating 240 may be preserved.

The sacrificial layer 270 may comprise Poly Silicon, which may be deposited on the substrate by a low pressure chemical vapor deposition (LPCVD) process. The thickness of the sacrificial layer may be determined by the desired depth of the resonant cavities in the final photonic crystal. For instance, the sacrificial layer may have a depth selected such that the depth of the resonant cavities is greater than half the period of the periodic array of holes.

Determining the period a of the plurality of holes may be based, at least in part, on a predetermined wavelength of light. For example, the predetermined wavelength of light can be a band gap wavelength of a photovoltaic cell. A possible range of the band gap wavelength can be from about 0.5 µm to about 3 µm. In one example, the period a may be less than the band gap wavelength to support at least one optical mode that can match the band gap wavelength. In another example, the period a is less than half of the band gap wavelength to reduce or minimize the diffraction loss at large incident angles. In this particular embodiment, the selective absorber can effectively absorb incident radiation at an incident angle from 0° (normal incidence) to about 70° (close to grazing incidence).

The patterning of the sacrificial layer 270 can be achieved by $SF_6$ based reactive ion etching (RIE) for Poly Silicon materials. A photoresist 420 is employed to transfer the pattern on the resist to the sacrificial layer 270. The pattern could be of any shape including, among others, round, square, rectangular, triangle or polygon. The shape may even be irregular if a particular optical mode is desired. In one exemplary embodiment, a sacrificial layer of 500 nm thick Poly Silicon is patterned via an optical stepper with a center wavelength of 369 nm. In the example shown in FIG. 4J, photo-mask 410 has a square checkerboard pattern and each square 411 in the pattern has a length 412 of 0.6 µm. Due to the resolution limit of the stepper and diffraction effects, the square pattern resolves to circles 421 on the developed photoresist with a minimum inter-circle spacing 422 of 100-200 nm as shown in FIG. 4K. This technique enables the formation of a photoresist with feature sizes (minimum inter-hole spacing in this example) smaller than the wavelength of the light (369 nm in this example) used for creating the photoresist pattern. In operation, smaller inter-hole spacing leads to a larger number of resonant cavities on a given piece of wafer, thereby improving the absorption efficiency of the photonic crystal and/or lowering the fabrication cost.

The supporting material in FIG. 4D may be $Al_2O_3$, which can be conformally deposited via atomic layer deposition (ALD). Note that conformal deposition results in the supporting material being disposed on every surface of the patterned sacrificial layer, including the top, the bottom, and the side wall(s) of each hole. A $Cl_2+BCl_3$ based RIE may be used for anisotropic etching, removing only the supporting material on the top and bottom of the holes, while leaving intact the supporting material on the side walls for further processing. The thickness of the supporting material may be determined out of functional consideration: the supporting structure stands by itself in the step shown in FIG. 4F and supports a metal layer 220 in the step shown in FIG. 4G. In one exemplary embodiment, a layer of 40 nm $Al_2O_3$ is used to construct the supporting structure.

The remaining portion of the sacrificial layer in FIG. 4F may be removed by $XeF_2$ gas phased etching, which reacts with Poly Silicon material but does not react significantly, if at all, with the $Al_2O_3$ supporting material, thereby creating a free-standing supporting structure made of the supporting material.

Another ALD may be used to deposit the metal layer 220 over the supporting structure 210 as in FIG. 4G. In another example, a sputtering process is employed to deposit a layer of tungsten or other metal over the supporting structure. Furthermore, chemical vapor deposition (CVD) may also be used in this step. Materials that can be used include tungsten, ruthenium, platinum, silver, tantalum, copper, gold and titanium, among others. However, for certain applications, non-metal materials such as silicon may also be used here if the reflectivity and degree of difficulty in fabrication is acceptable. The thickness of the metal layer 220 can be greater than the skin depth of the wavelength of interest in order to define clear optical modes. If, however, the thickness of the metal layer 220 is less than the skin depth, the supporting structure compensate and alter the absorption properties by allowing for modes within the cavities defined by supporting structure. In this case, by tuning the combination of the supporting structure and the metal layer, desired absorption spectra can be achieved.

The dielectric material 230 can also be deposited into the resonant cavities by an ALD process. In one exemplary embodiment, a 36-hour ALD deposition of $HfO_2$ is used to fill up the cavities. Other materials that may be used to fill the cavities include $SiO_2$, $TiO_2$, $Al_2O_3$, TiN or other oxide ceramic known in the art. ALD deposition may results in excess dielectric materials in certain areas on top of the wafer. A chemical mechanical polishing (CMP) may be used in this case to remove the excess material, thereby creating a flat surface.

The fabrication method may further include an annealing process to refine the selective absorber and remove undesired gap modes so as to improve the absorption properties. The annealing may be achieved by placing the resonant cavities in an inert environment at high temperature for an extended period of time. The inert environment may be substantially void of oxygen to prevent oxidation of the metal and other materials. In one example, the inert environment comprises 95% Argon and 5% Hydrogen. The temperature may be around 1000° C. and the extended period of time may be around 24 hours.

FIGS. 5A-5F show images of a selective absorber during and after fabrication according to the process illustrated in FIGS. 4A-4I. In FIG. 5A, a photoresist is patterned with a square checkerboard photo-mask with a period of 0.6 µm. An inter-hole spacing of 200 nm is achieved via a combination of exposure time and photoresist developing over-etching. FIG. 5B shows the device after the fabrication step in FIG. 4E. Sidewalls of $Al_2O_3$ and the remaining portion of the sacrificial layer of Poly Silicon are shown. In FIG. 5C, the Poly Silicon has been removed via $XeF_2$, leaving only the $Al_2O_3$ shell as the supporting structure. This image shows the device after the fabrication step in FIG. 4F. In FIG. 5D, approximately 80 nm of ruthenium has been conformally deposited via ALD to create a plurality of resonant cavities arrayed periodically on the substrate. FIG. 5E shows a final selective absorber in which a thin layer of the dielectric material is left on top of the resonant cavities to function as an anti-reflection layer. FIG. 5F shows another final selective absorber in which excess dielectric material has been totally removed and the metal-dielectric interface is directly exposed to incident radiation.

Figures 6A, 6B:
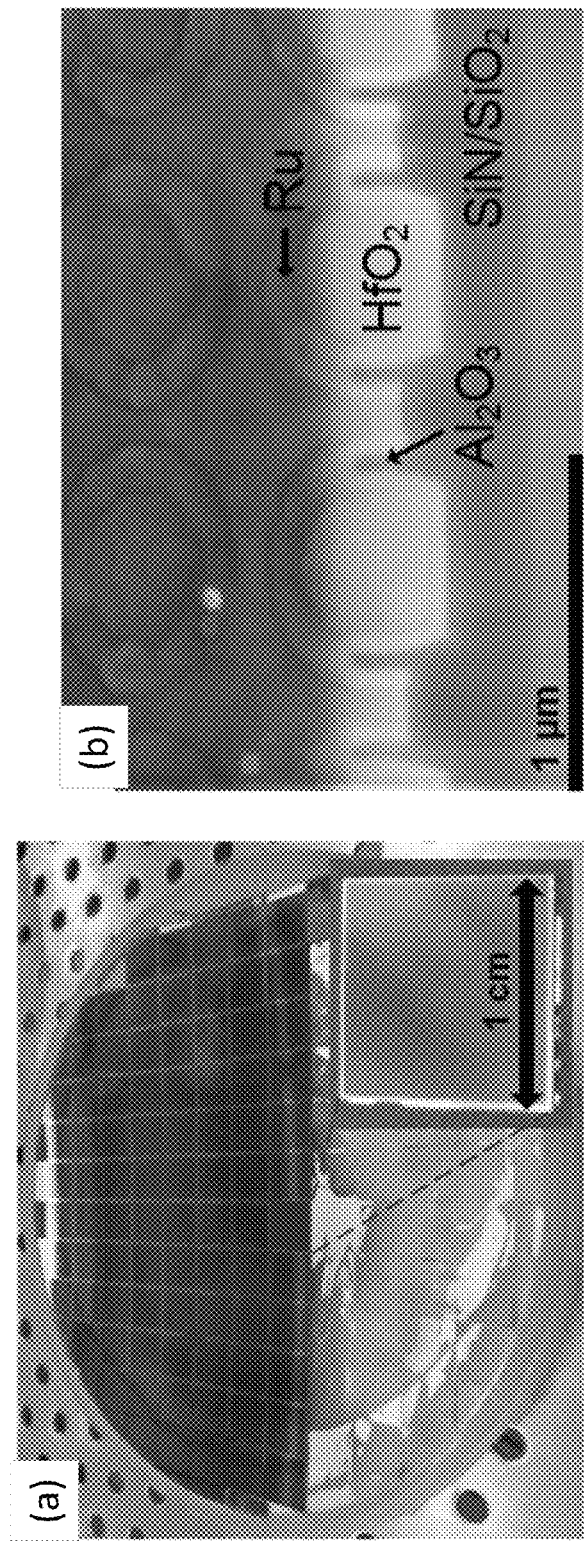
FIG. 6A shows a photo of a 6-inch wafer on which several selective absorbers photonic crystals are located.
FIG. 6B shows an SEM image of the cross section of a selective absorber photonic crystal taken at a 42° angle.

FIG. 6A shows a fully fabricated 6" wafer on which the selective absorber is created according to the method described above with respect to FIGS. 4A-4I. The wafer has been diced into 1 cm×1 cm chips. FIG. 6B is a SEM image of the cross-section of the selective absorber in one of the diced chips shown in FIG. 6A. The image is taken at a 42° angle to better show the structure of the device. FIGS. 6A and 6B also demonstrate that the employed fabrication method is wafer-scale, thereby allowing mass production of the selective absorber to meet high demands in alternative energy sources.

Experimental Measurement of a Selective Absorber

Figure 7:
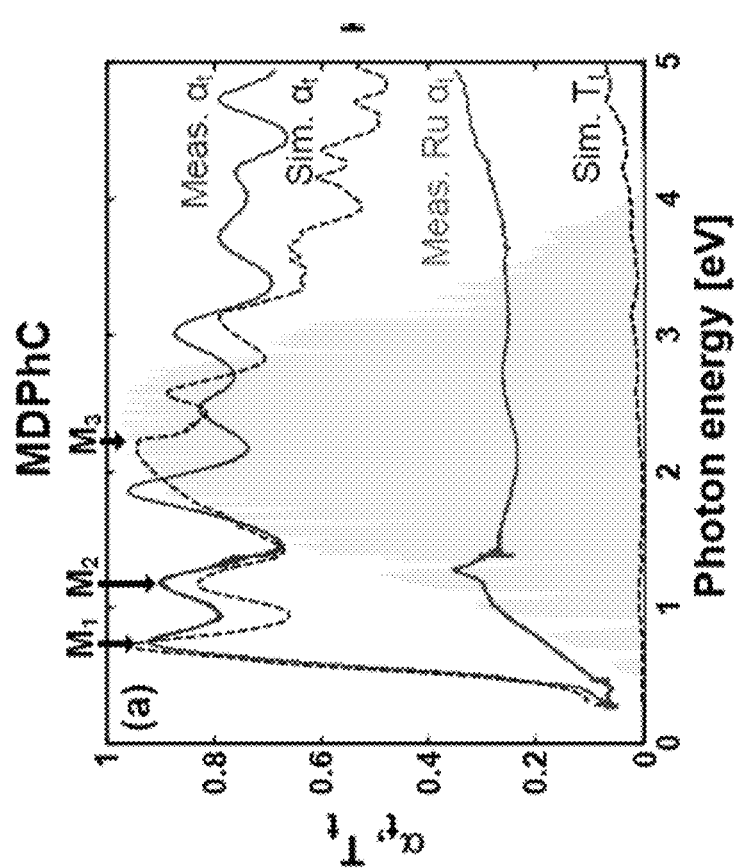
FIG. 7 shows experimental and simulated absorption spectra of a photonic crystal produced using the process shown in FIGS. 4A-4K and of a flat ruthenium layer is also included for comparison.

As an example, a selective absorber is fabricated according to the method described above using $Al_2O_3$ as the supporting material, Ruthenium for the metal layer, and $HfO_2$ for the dielectric filling. The selective absorber has a period of 780 nm. For each resonant cavity 200 (FIG. 2), the dimensions are as follows: radius r of the resonant cavity 200 is 200 nm, depth of the cavity 200 is also 200 nm, thickness of the metal layer 220 is 80 nm, thickness of the supporting wall 210 is 40 nm, thickness of the anti-reflection coating 240 is 25 nm. FIG. 7 shows the measured absorption spectrum of the selective absorber, demonstrating the broadband absorption of the device across the majority of the solar spectrum (here, between about 0.25 µm and about 1.3 µm) along with a steep cut-off at a wavelength of about 1.65 µm. Note the absorption is plotted as a function of photon energy. The cut-off occurs at a photon energy of about 0.75 eV, which corresponds to a cut-off wavelength of 1.65 µm. The cut-off wavelength is located at mode M1 of the resonant cavities. The absorption stays at around 80% at wavelengths below the cut-off wavelength (above the cut-off photon energy) but drops to below 10% at wavelengths above the cut-off wavelength (below the cut-off photon energy).

Without being bound by any particular theory, the broadband optical properties of the selective absorber in the visible regime may be a result of the combination of a high density of cavity modes and an ARC layer. The dielectric filling essentially red-shifts the frequencies of the high order cavity modes to create a high density of states in the visible regime. Experimentally, this can be observed in the larger number of peaks in the measured absorption spectrum, each of the peaks corresponds to an optical mode of the resonant cavity. The first two modes, M1 and M2, are standard cavity modes; however, the third mode, M3 supports a hybrid cavity and surface plasmon polaritons (SPP) mode. The coupling between cavity and SPP modes may also contribute to the increased absorption in the M3 mode. As comparison, the absorption spectrum of a flat ruthenium layer is also presented. The absorption percentage is much lower and the cut-off frequency is much less sharp.

Figure 8:
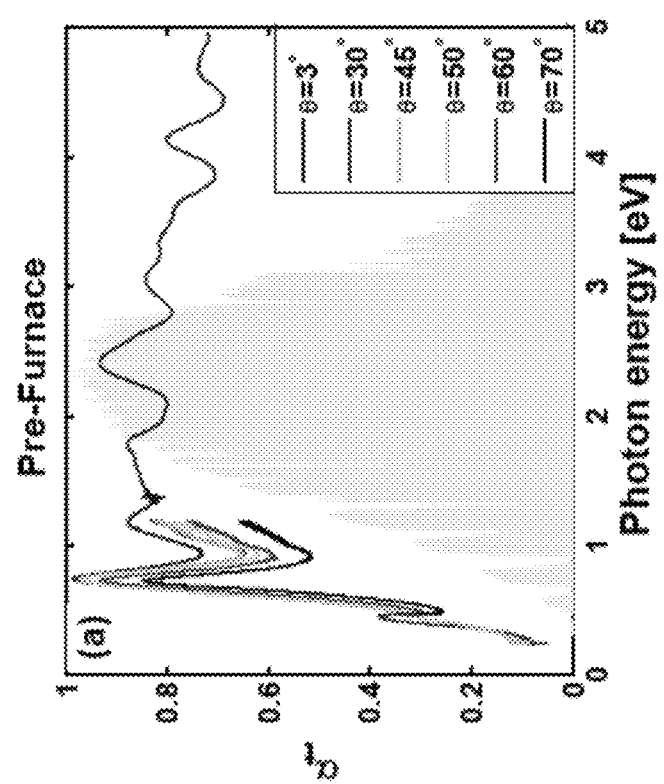
FIG. 8 shows the experimental absorption spectra of a photonic crystal produced using the process shown in FIGS. 4A-4K for radiation at different incidence angles.

Measured spectra at various incident angles are shown in FIG. 8, demonstrating the large acceptance angle of the selective absorber up to 70°. As explained above, the dielectric filling in the resonant cavities down-shifts the frequency of the low order modes to be below the diffraction threshold and thus improves the wide angle absorption. The cavity modes in FIG. 7 remain relatively fixed in frequency as a function of angle, which is a characteristic of the cavity modes.

Figure 9:
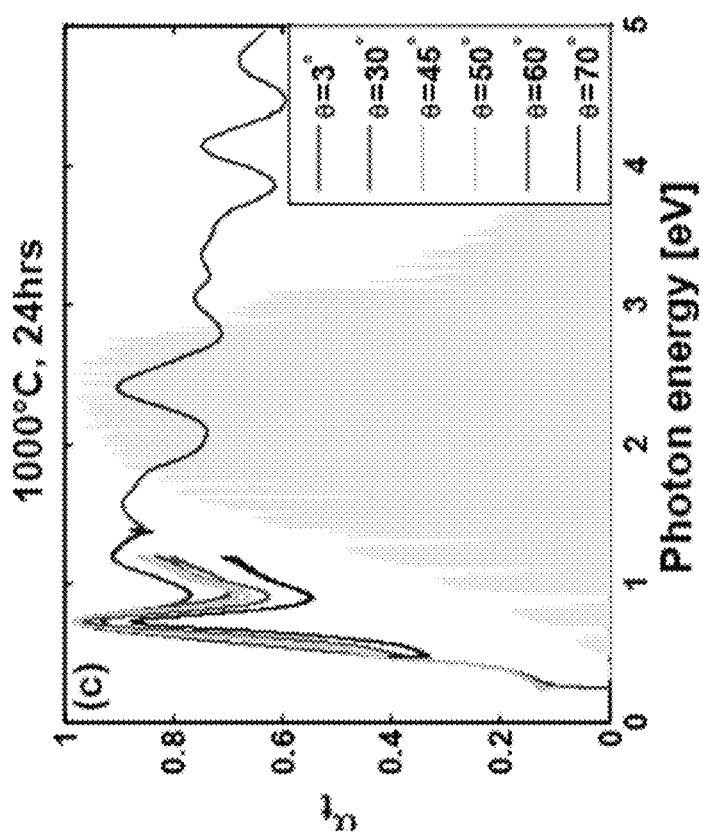
FIG. 9 shows the experimental absorption spectra of a photonic crystal produced using the process shown in FIGS. 4A-4K after annealing in an oven at 1000° C. for 24 hours.

The selective absorber was then placed at 1000° C. for 24 hours in a 95% Ar and 5% $H_2$ environment and measured again as shown in FIG. 9 where the absorption peaks remain high, thus demonstrating the high temperature structural stability.

Figure 10:
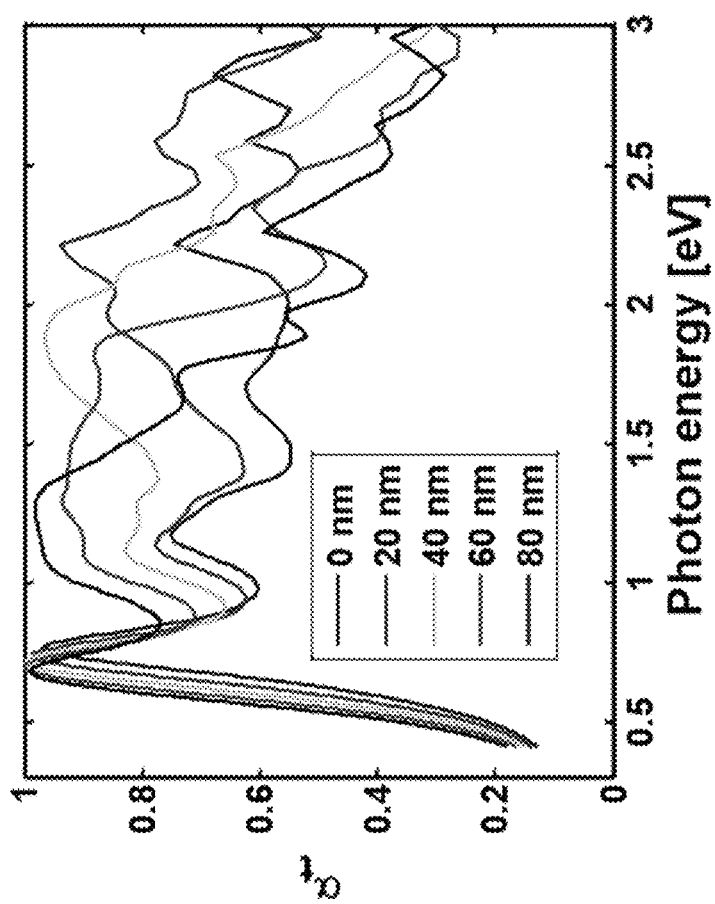
FIG. 10 shows the simulated absorption spectra of selective absorber photonic crystals with anti-reflection coatings of different thicknesses.

FIG. 10 shows the simulated absorption spectra as a function of the ARC thickness. As the ARC layer increases in thickness, the overlap between the cavity modes and the ARC layer reflection spectrum red shifts. Thus, based on the application, different absorption spectra can be obtained by simply varying the ARC layer. A global optimization of the cavity geometry, ARC layer thickness, material thicknesses, and materials could be performed to create a desired absorption profile. The high sensitivity of ARC layer on the absorption spectrum may have applications beyond visible light. For instance, in the infrared and terahertz region of the electromagnetic spectrum, dielectric ARC layers may be useful for chemical sensing and imaging applications, such as those employed at airport security checks. In another example, dielectric ARC layers may be used for biosensors due to the change of resonant frequency in the presence of biomolecules on the coating when illuminated.

Figure 11:
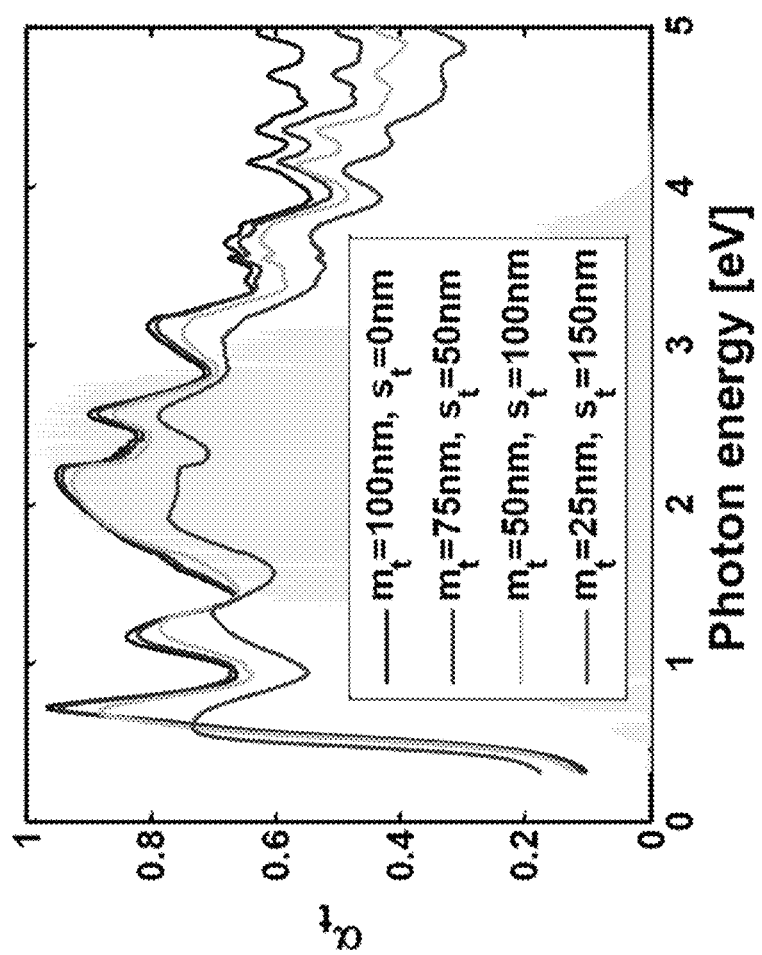
FIG. 11 shows simulated absorption spectra of selective absorber photonic crystals with supporting structures and metal layers of different thicknesses.

FIG. 11 demonstrates the effect of metal layer thickness $m_t$ on the absorption spectrum, where both the metal layer and the supporting layer thicknesses are varied to keep the inner radius constant. For metal layer thickness $m_t$ greater than the skin depth, the absorption spectra remain relatively constant, as seen for $m_t$>50 nm. In this regime, the thickness of the $Al_2O_3$ $s_t$ has no impact on the absorption spectra since the fields do not significantly penetrate the metal.

Once the metal thickness is below the skin depth, as shown for $m_t$=25 nm, the transmission of the fields through the metal lowers the absorption spectra. In this regime, the thickness of the $Al_2O_3$ can alter the absorption spectra by allowing for modes within the $Al_2O_3$ to occur.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A photonic crystal for absorbing sunlight, comprising:
   a periodic structure defining a two-dimensional array of resonant cavities, the periodic structure having a period less than a predetermined cut-off wavelength;
   a layer of metal disposed on an inner surface of at least one resonant cavity in the plurality of resonant cavities, the at least one resonant cavity supporting at least one optical mode; and
   a dielectric material, deposited within the at least one resonant cavity comprising a cylindrical waveguide, having a dielectric constant selected such that the at least one optical mode has a wavelength substantially equal to the predetermined cut-off wavelength so as to cause the photonic crystal to convert the sunlight at wavelengths below the pre-determined cut-off wavelength into heat energy.

2. The photonic crystal of claim 1, wherein the photonic crystal is configured to absorb the sunlight over a wavelength range of about 0.5 µm to 3 µm and over an angular range of about 0° to about 70°.

3. The photonic crystal of claim 1, wherein the layer of metal has a thickness equal to or greater than a skin depth of the layer of metal at the predetermined cut-off wavelength.

4. The photonic crystal of claim 1, further comprising:
   an anti-reflection coating disposed on top of the periodic structure, the anti-reflection coating having a thickness of about 1 nm to about 200 nm.

5. The photonic crystal of claim 1, wherein the layer of metal comprises at least one of tungsten, ruthenium, platinum, silver, gold, copper, titanium, or tantalum.

6. The photonic crystal of claim 1, wherein:
   the layer of metal has a first thermal expansion coefficient; and
   the dielectric material has a second thermal expansion coefficient less than the first thermal expansion coefficient.

7. The photonic crystal of claim 1, wherein the dielectric material comprises at least one of $SiO_2$, $TiO_2$, $Al_2O_3$, or $HfO_2$.

8. The photonic crystal of claim 1, wherein the period is equal to or less than half of the predetermined cut-off wavelength.

9. The photonic crystal of claim 1, wherein the cavity has a depth that is at least half the period of the periodic structure.

10. A photonic crystal of for absorbing incident radiation, comprising:
    a periodic structure defining a plurality of resonant cavities, the periodic structure having a period less than a predetermined cut-off wavelength;
    a layer of metal disposed on an inner surface of at least one resonant cavity in the plurality of resonant cavities, the at least one resonant cavity supporting at least one optical mode;
    a dielectric material, deposited within the at least one resonant cavity, having a dielectric constant selected such that the at least one optical mode has a wavelength substantially equal to the predetermined cut-off wavelength; and
    an anti-reflection coating disposed on top of the periodic structure, the anti-reflection coating having a thickness of about 1 nm to about 200 nm,
    wherein the anti-reflection coating comprises a layer of the dielectric material.

11. A photonic crystal for incident radiation, comprising:
a periodic structure defining a plurality of resonant cavities, the periodic structure having a period less than a predetermined cut-off wavelength;
a layer of metal disposed on an inner surface of at least one resonant cavity in the plurality of resonant cavities, the at least one resonant cavity supporting at least one optical mode;
a dielectric material, deposited within the at least one resonant cavity, having a dielectric constant selected such that the at least one optical mode has a wavelength substantially equal to the predetermined cut-off wavelength, and
a diffusion barrier layer, disposed below the periodic structure, to prevent diffusion or mixing of the layer of metal and a substrate.

12. A method of fabricating a photonic crystal for absorbing sunlight, the method comprising:
A) providing a substrate coated with a sacrificial layer;
B) patterning the sacrificial layer with a plurality of holes arrayed at a period equal to or less than a predetermined cut-off wavelength;
C) depositing a supporting material over an inner wall of at least one hole in the plurality of holes;
D) removing a remaining portion of the sacrificial layer to form at least one supporting structure defined by the supporting material;
E) depositing a layer of metal on the at least one supporting structure to form a periodic structure defining a two-dimensional array of resonant cavities, the periodic structure having a second period less than the predetermined cut-off wavelength and at least one resonant cavity in the two-dimensional array of resonant cavities comprising a cylindrical waveguide; and
F) depositing a dielectric material in the at least one resonant cavity, the dielectric material having a dielectric constant selected such that at least one optical mode supported by the at least one resonant cavity has a wavelength substantially equal to the predetermined cut-off wavelength so as to cause the photonic crystal to convert the sunlight at wavelengths below the predetermined cut-off wavelength into heat energy.

13. The method of claim 12, wherein B) comprises patterning the sacrificial layer using a reactive ion etching process.

14. The method of claim 13, wherein B) comprises:
B1) disposing a photo-mask having a checkerboard pattern in optical communication with a photoresist disposed on the sacrificial layer;
B2) irradiating the photo-mask at an irradiation wavelength so as to define a plurality of holes in the photoresist, the plurality of holes having a minimum inter-hole spacing less than the irradiation wavelength; and
B3) etching the plurality of holes into the sacrificial layer via the photoresist.

15. The method of claim 12, wherein C) comprises depositing the supporting layer using an atomic layer deposition process.

16. The method of claim 12, wherein D) comprises a $XeF_2$ gas phased etching process.

17. The method of claim 12, wherein E) comprises depositing the layer of metal using at least one of atomic layer deposition, sputtering, or chemical vapor deposition.

18. The method of claim 12, wherein F) comprises depositing the dielectric material using an atomic layer deposition process.

19. The method of claim 12, further comprising:
G) depositing a layer of the dielectric material on the resonant cavity so as to form an anti-reflection coating on the photonic crystal.

20. The method of claim 12, further comprising;
H) annealing the resonant cavity so as to remove undesired gap modes and/or increase absorption.

21. The method of claim 12, wherein:
the substrate is further coated with a diffusion barrier layer beneath the sacrificial layer, the diffusion barrier layer comprising at least one of SiN or $SiO_2$.

22. The method of claim 12, wherein the sacrificial layer comprises polysilicon.

23. The method of claim 12, wherein the supporting material comprises $Al_2O_3$.

24. The method of claim 12, wherein the layer of metal comprises at least one of tungsten, ruthenium, platinum, silver, gold, copper, titanium, and tantalum.

* * * * *